United States Patent [19]

Nyqvist

[11] Patent Number: 5,001,372
[45] Date of Patent: Mar. 19, 1991

[54] CIRCUITRY FOR MAKING A DIFFERENTIAL OUTPUT SINGLE-ENDED

[75] Inventor: Jouni Nyqvist, Muurla, Finland

[73] Assignee: Nokia-Mobira Oy, Salo, Finland

[21] Appl. No.: 328,436

[22] Filed: Mar. 24, 1989

[30] Foreign Application Priority Data

Apr. 5, 1988 [FI] Finland ............................. 881570

[51] Int. Cl.$^5$ ............................................. H03B 19/00
[52] U.S. Cl. .................................. 307/529; 307/494; 307/491; 328/156; 330/257
[58] Field of Search ............... 307/529, 491, 494; 328/142, 156; 330/257, 261

[56] References Cited

U.S. PATENT DOCUMENTS

| | | | |
|---|---|---|---|
| 4,347,531 | 8/1982 | Yamakoshi et al. ................ | 358/172 |
| 4,379,268 | 4/1983 | Nagata ................................ | 330/257 |
| 4,464,632 | 8/1984 | Yoshihisa et al. .................. | 330/257 |
| 4,494,075 | 1/1985 | Yoshihisa et al. .................. | 330/257 |
| 4,529,893 | 7/1985 | Nagano .............................. | 307/494 |
| 4,847,524 | 7/1989 | Van Rooy et al. ................. | 307/491 |

FOREIGN PATENT DOCUMENTS 60-214611 10/1985 Japan .
6161509 3/1987 Japan .

Primary Examiner—Timothy P. Callahan
Attorney, Agent, or Firm—Darby & Darby

[57] ABSTRACT

Balanced mixers with respect to their output stages are created by making the differential mixer output (A, B) a single-ended output (C) without a matching transformer. The circuitry can be used in all balanced transistor mixers, provided that both sides of the differential output are available for use.

3 Claims, 3 Drawing Sheets

CIRCUITRY FOR MAKING A DIFFERENTIAL OUTPUT SINGLE-ENDED

BACKGROUND OF THE INVENTION

The present invention relates to a circuit for converting the differential outputs of a balanced mixed into a single-ended output. The circuit is implemented by using semiconductors without transformer matching. The circuit can be used in all balanced transistor mixers, provided that both sides of the differential output are available for use.

Because of the construction of the conventional prior-art transistor mixer, shown in FIG. 1, the balanced output is located on the collectors of the transistors and has a high impedance (approximately 100 kohm). In general, the mixer is always followed by some kind of a filter by means of which non-desirable mixing results are eliminated. The impedances of the filters, for their part, are considerably lower, approximately 2.5 kohm–50 ohm. Traditionally, the matching necessary to achieve power transfer is carried out by using transformer matching, as shown in FIG. 2. The exploitation of balancing will in this case suppress any distortion of the output signal. An alternative method of matching the output impedance of such a mixer circuit for the filters is to use resistances, as shown in FIG. 3, or to use other similar impedance matching circuits.

The output signal in the single-ended output D of the prior-art matching circuit, shown in FIG. 2, based on a transformer M, fulfills the requirements imposed on the quality of the signal i.e. a matched impedance and a low value of distortion, but in present-day receiver-transmitter applications, transformers are no longer used, since they are large in size, heavy, expensive and need to be tuned.

In most commercial mixer circuits the output impedances are matched for the filters by using corresponding resistances, such as RL, shown in FIG. 3. The problem in this case is that, in the absence of transformer circuitry, only one side, either A or B, of this differential output can be used, since the inputs of the filters are not differential.

By using the mixer without the transformer circuit, the following problems may arise at high input signal levels: the output signal is clipped asymmetrically; the output signal collapses, the mixing gain disappears; the harmonics of the output signal dominate strongly.

In the case of a high-level input signal there are thus, in both branches A and B of the differential output of the mixer of FIG. 3, mixing results which have been clipped and distorted at the peak. Such high-distortion signals of the differential outputs of a conventional mixer are shown in FIG. 4.

SUMMARY OF THE INVENTION

By the use of the circuitry according to the present invention, a crucial improvement is achieved with respect to the disadvantages described above. According to the invention the differential outputs of a balanced mixer are converted into a single-ended output by circuitry that includes a transistor current mirror. The collector of each transistor of the current mirror is coupled to one of the two branches of the differential output of the mixer. The output of the current mirror, which is at the collector of the current mirror transistor, is coupled as an amplifier. using only transistors or corresponding semiconductors and resistors, the same properties can be attained as those attained by using conventional transformer matching. The advantages of the present invention are the insignificant distortion of the output signal (even at high input signal level), a single-ended output, small size and inexpensive circuitry. In addition, the circuitry does not require specific tuning.

BRIEF DESCRIPTION OF THE DRAWINGS

The invention is described below in detail, with reference to the accompanying drawings.

DESCRIPTION OF THE PREFERRED EMBODIMENTS OF THE PRESENT INVENTION

Figure 5:
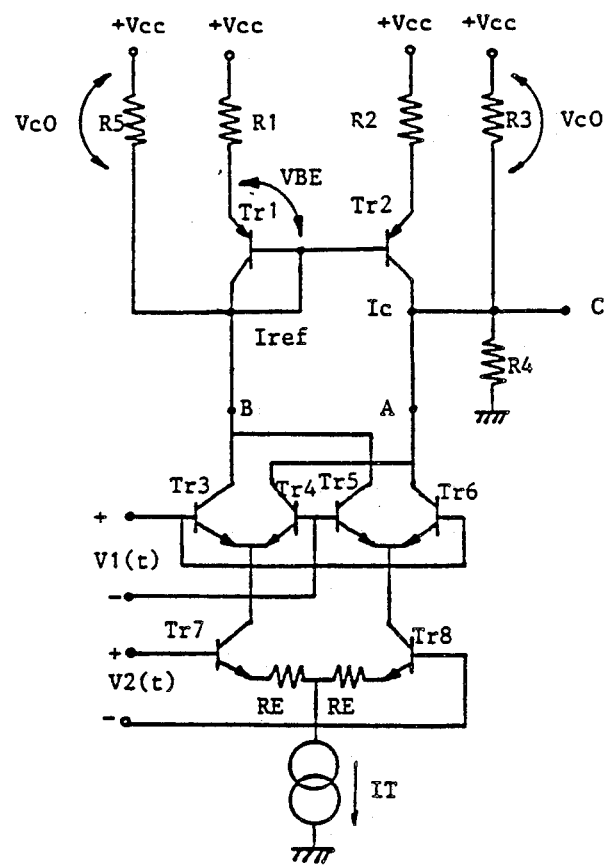
FIG. 5 depicts a current mirror circuit according to the invention, connected to the mixer of FIG. 1.

In the present invention, the mixer output matching from the differential output A, B to the single-ended output C is implemented by means of transistors by using the properties of the current mirror circuitry depicted in FIG. 5. At its simplest the current mirror usually consists of two identical transistors Tr1 and Tr2, the bases of which are directly coupled to each other. One of the transistors, in this case Tr1, is coupled as a diode, and its base-emitter voltage Vbe controls the base current to the transistor Tr2. In addition to this actual current mirror, the circuitry has current-control resistors R1 and R2. The current mirror inverts the reference current Iref into output current Ic. In other words, it is included in the properties of the current mirror that, approximately, Iref=Ic and, precisely calculated, $Ic = Iref(\beta/(\beta+2))$, where $\beta$ = the current gain coefficient of the transistor.

Figure 1:
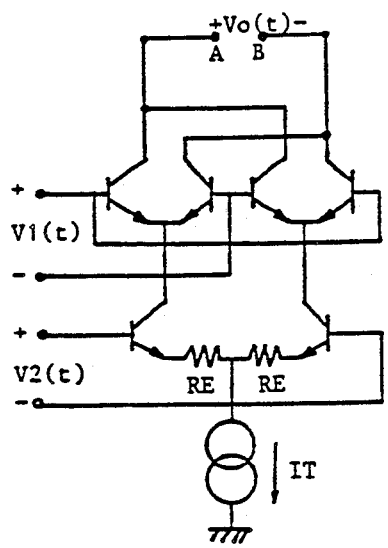
FIG. 1 depicts a prior art circuit for a balanced mixer.
Figure 2:
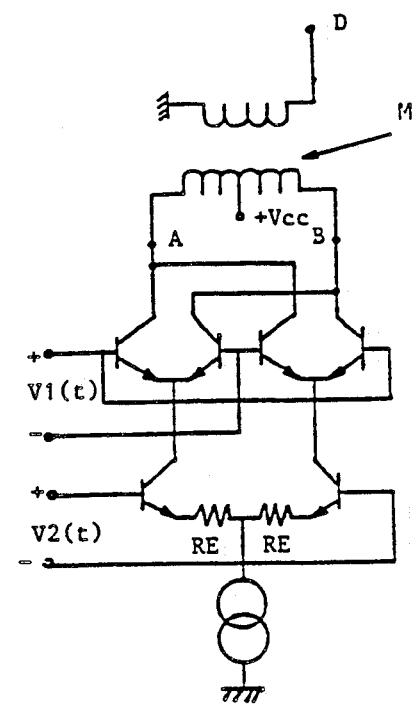
FIG. 2 depicts a prior art transformer circuit with of the differential outputs of the mixer for FIG. 1.
Figure 3:
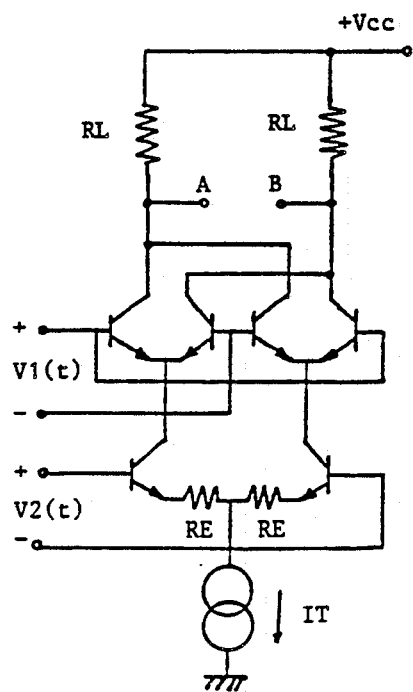
FIG. 3 depicts a prior art circuit for matching the output impedance of the mixer of FIG. 1, in which case only one of the differential outputs is available for use.

The current mirror transistors Tr1 and Tr2 constitute the basic structure of the current mirror, and they are coupled to the differential outputs of the mixer in such a way that the collector of the first transistor Tr1 is coupled to the output B and the collector of the second transistor Tr2 is connected to the other output A. The resistors R1 and R2 are provided to balance any base/emitter voltage offset due to the mismatching of the transistors and any offset between the temperature coefficients $\Delta Vbe/\Delta T$. By means of the resistors R3 and R4 the output impedance can be matched for the filter at any given time, and the output voltage level can be set within the optimal operating range. The resistor R5 is not necessary, but it is often included in the circuitry if some commercial microcircuit or integrated circuit is used. In this case the resistors R5 and R3 are equal and are integrated within the circuit. The transistors Tr3–Tr8 constitute the actual mixer part, as in FIGS. 1–3, and are within the microcircuit. In certain commercial circuits, where one of the outputs of the mixer is coupled internally to the supply voltage line, the current mirror circuitry cannot be used.

Figure 6:
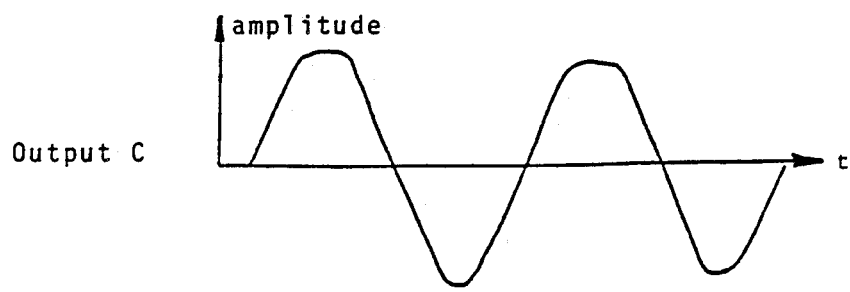
FIG. 6 depicts the low-distortion output signal obtained using circuitry according to FIG. 5.

In the mixer the signals are, in accordance with the differential output, of mutually opposite phases. Since the current mirror is an inverting circuit with respect to the signal, the outputs A and B can be interconnected by means of a current mirror. In this case, at the output point C of the current mirror, coupled in accordance with the invention to the mixer, there can be observed a signal which has increased in amplitude and been somewhat clipped symmetrically, as shown in FIG. 6, i.e. signal amplification has occurred. It can be shown that in principle the circuitry according to the invention has a 3 dB additional amplification as compared with ordinary mixer amplification. In practice the resistors R1 and R2 somewhat reduce the amplification, but an additional amplification of approximately 2.5 dB is highly realistic.

Figure 4:
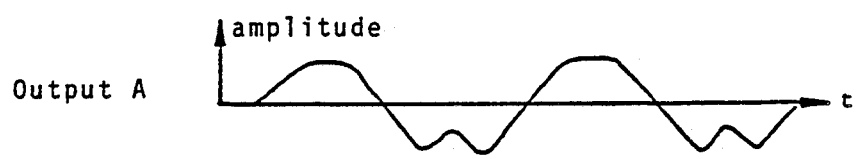
FIG. 4 depicts signals appearing in the differential outputs A and B of FIGS. 1 and 3.
Figure 4:
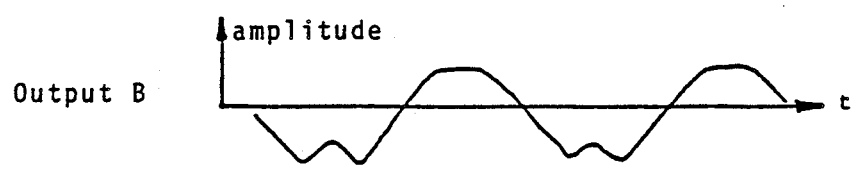

The circuitry described eliminates the asymmetrical clipping of the output signal and effectively suppresses the dominating effect of the harmonics of the output signal. Otherwise, at high input-signal levels, the pre-voltages of a mere uncoupled mixer, i.e. a mixer coupled in accordance with FIG. 3, tend to change to such an extent, since the current tends to increase, that the output signal will collapse or distort, as seen in FIG. 4. Since the current mirror forms an active load for the mixer, variation of the direct current of the mixer does not significantly alter the operating point of the whole circuitry.

It can be seen as an additional advantage that the matching circuitry according to the invention is wideband and has no tuning requirement. The current mirror may be, depending on the construction of the mixer, either of the PNP type or of the NPN type, depending on whether the output stage of the mixer is respectively of the NPN type or of the PNP type.

There is only one significant condition pertaining to the circuitry. If the circuitry of the mixer used as a point of departure is such that the matching resistors R5 and R3 of FIG. 5 are within the circuit and the collector currents of Tr3, Tr5 and Tr4, Tr6 are so low that the voltage loss Vco at the resistors R5 and R3 is below the base emitter voltage Vbe of Tr1 and Tr2 (i.e. under approximately 0.6 V) current mirror circuitry cannot be used. If the outputs are of the open collector form, the resistors can be matched according to the current and the load impedance in each given case.

If the mixer is of the type that only one output, either the A output or the B output, is available for use, the current mirror circuitry cannot be applied.

Figure 7:
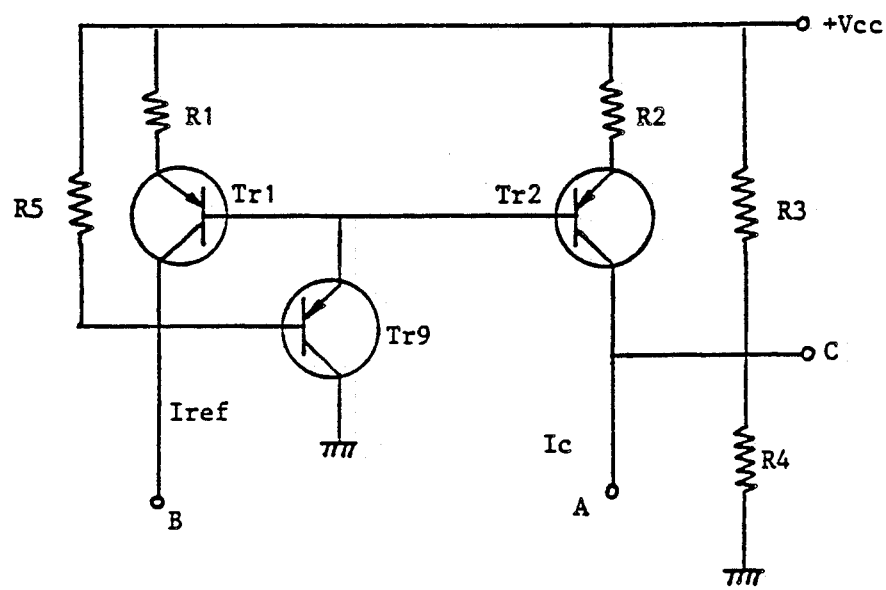
FIG. 7 depicts the base-current compensation circuitry in the current mirror.

In practice the current mirror can be implemented by using the basic circuitry depicted, but it is possible to make the current mirror more precise by using base-current compensating circuitry, as shown in FIG. 7, in which a separate current amplifier, in the form of a transistor Tr9, has been set up for the base current. The output impedance of the current mirror can also be increased by means of supplementary stages, for example by using so-called Wilson's current mirror and/or current mirrors coupled in cascade. It can, however, be noted that the basic circuitry is sufficient for operation in most situations. If the transistors Tr1 and Tr2 are identical, i.e. matched precisely enough, it is possible to leave out the resistors R1 and R2 altogether.

In accordance with what has been presented, it is possible to carry out the load matchings by using resistors R5, R3 and R4, but variations are indeed possible. The main idea is that the output impedance at the output C should correspond to the necessary filter impedance and the voltage level of the output should be at the mid-point of the operating range.

The basic circuitry of the current mirror is highly usable for the reason that the transistor pair in question is available as a matched pair in one case. The resistors R5 and R3 are usually provided in connection with the mixer, and so the only supplementary components needed are the resistors R1, R2 and R4.

It has been noted that the invention described significantly improves the properties of the mixer involved.

I claim:

1. A circuit in which the differential outputs of a balanced mixer are converted into a single ended output, characterized in that the circuit comprises a transistor current mirror including at least two transistors, one of said transistors being connected as an amplifier, each transistor of said current mirror being coupled in parallel to at least one resistance, said resistance selected so that voltage loss caused by collector currents in said resistances are greater than the base-emitter voltage of said current mirror transistors, the collector of each current mirror transistor being coupled to one of two branches of the differential outputs of the mixer, respectively, and the output of said current mirror transistor being at the collector of said current mirror transistor connected as an amplifier.

2. The circuit according to claim 1, wherein the balanced mixer has at least two output transistors and the collectors of said current mirror transistors are coupled directly to the collectors of said mixer output transistors, without matching resistors in between.

3. The circuit according to claims 1 or 2, characterized in that matching resistors are coupled in series to the emitters of said current mirror transistors in order to match these transistors to each other.

* * * * *